United States Patent
Peng et al.

(10) Patent No.: US 10,640,681 B1
(45) Date of Patent: May 5, 2020

(54) CHEMICAL MECHANICAL POLISHING COMPOSITION AND METHOD FOR TUNGSTEN

(71) Applicant: Rohm and Haas Electronic Materials CMP Holdings, Inc., Newark, DE (US)

(72) Inventors: Jia De Peng, Chino Hills, CA (US); Lin-Chen Ho, Taichung (TW); Benson Po-Hsiang Chi, Hsinchu County (TW)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/166,087

(22) Filed: Oct. 20, 2018

(51) Int. Cl.
C09G 1/02 (2006.01)
H01L 21/304 (2006.01)
H01L 21/321 (2006.01)

(52) U.S. Cl.
CPC ............ C09G 1/02 (2013.01); H01L 21/3212 (2013.01)

(58) Field of Classification Search
CPC .................................................... H01L 21/304
See application file for complete search history.

(56) References Cited

U.S. PATENT DOCUMENTS

| | | | |
|---|---|---|---|
| 4,528,023 A * | 7/1985 | Ahle ...................... A01N 25/30 | 504/190 |
| 6,083,838 A | 7/2000 | Burton et al. | |
| 7,004,819 B2 | 2/2006 | Moeggenborg et al. | |
| 7,247,567 B2 | 7/2007 | Vacassy et al. | |
| 8,071,479 B2 | 12/2011 | Liu | |
| 8,492,276 B2 | 7/2013 | Abe et al. | |
| 2008/0148649 A1 * | 6/2008 | Liu ........................... C09G 1/02 | 51/298 |
| 2009/0184287 A1 | 7/2009 | Chang | |
| 2009/0209788 A1 | 8/2009 | Nguyen et al. | |
| 2013/0053291 A1 * | 2/2013 | Otake ....................... C11D 3/36 | 510/175 |
| 2015/0021513 A1 * | 1/2015 | Kim ...................... C09K 3/1463 | 252/79.4 |
| 2015/0259572 A1 | 9/2015 | Grumbine et al. | |
| 2016/0237315 A1 | 8/2016 | Stender et al. | |
| 2017/0088748 A1 * | 3/2017 | Stender ............. H01L 21/31053 | |
| 2018/0244955 A1 * | 8/2018 | Henry ....................... C09G 1/02 | |

* cited by examiner

*Primary Examiner* — Shamim Ahmed
(74) *Attorney, Agent, or Firm* — John J. Piskorski

(57) ABSTRACT

A composition and method for chemical mechanical polishing a substrate containing tungsten to at least inhibit corrosion of the tungsten. The composition includes, as initial components: water; an oxidizing agent; a select polyethoxylated tallow amine; a dicarboxylic acid, a source of iron ions; a colloidal silica abrasive; and, optionally, a pH adjusting agent; and, optionally, a biocide. The chemical mechanical polishing method includes providing a chemical mechanical polishing pad, having a polishing surface; creating dynamic contact at an interface between the polishing pad and the substrate; and dispensing the polishing composition onto the polishing surface at or near the interface between the polishing pad and the substrate; wherein some of the tungsten is polished away from the substrate and corrosion of the tungsten is inhibited.

9 Claims, No Drawings

CHEMICAL MECHANICAL POLISHING COMPOSITION AND METHOD FOR TUNGSTEN

FIELD OF THE INVENTION

The present invention is directed to the field of chemical mechanical polishing of tungsten to at least inhibit corrosion of the tungsten. More specifically, the present invention is directed to a composition and method for chemical mechanical polishing of tungsten to at least inhibit corrosion of the tungsten by providing a substrate containing tungsten; providing a polishing composition, containing, as initial components: water; an oxidizing agent; a select polyethoxylated tallow amine in sufficient amounts to at least inhibit corrosion of the tungsten; a dicarboxylic acid, a source of iron ions; a colloidal silica abrasive; and, optionally, a pH adjusting agent; and optionally, a biocide; providing a chemical mechanical polishing pad, having a polishing surface; creating dynamic contact at an interface between the polishing pad and the substrate; and dispensing the polishing composition onto the polishing surface at or near the interface between the polishing pad and the substrate where some of the tungsten is polished away from the substrate and to at least inhibit corrosion of the tungsten.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry. However, there is a great deal of complexity involved in CMP. Each type of material requires a unique polishing composition, a properly designed polishing pad, optimized process settings for both polish and post-CMP clean and other factors that must be individually tailored to the application of polishing a particular material.

Chemical mechanical polishing has become a preferred method for polishing tungsten during the formation of tungsten interconnects and contact plugs in integrated circuit designs. Tungsten is frequently used in integrated circuit designs for contact/via plugs. Typically, a contact or via hole is formed through a dielectric layer on a substrate to expose regions of an underlying component, for example, a first level metallization or interconnect. Tungsten is a hard metal and tungsten CMP runs at relatively aggressive settings which poses unique challenges for tungsten CMP. Unfortunately, many CMP slurries used to polish tungsten, because of their aggressive nature, cause corrosion of the tungsten. The corrosion of tungsten is a common side-effect of CMP. During the CMP process the metal polishing slurry that remains on the surface of the substrate continues to corrode the tungsten beyond the effects of the CMP. Sometimes corrosion is desired; however, in most semiconductor processes corrosion is to be reduced or, preferably, inhibited altogether.

Another problem associated with CMP tungsten is, unfortunately, that many CMP slurries used for polishing tungsten cause the problem of over-polishing and dishing resulting in non-uniform or nonplanar surfaces. The term "dishing" refers to excessive (unwanted) removal of metal, such as tungsten, from metal interconnect precursors and other features on semiconductors during CMP, thereby causing unwanted cavities in the tungsten. Dishing is undesirable since, in addition to causing nonplanar surfaces, it negatively affects the electrical performance of the semiconductor. The severity of the dishing can vary but it typically is severe enough to cause erosion of underlying dielectric materials such as silicon dioxide (TEOS).

The topographical defects which can result from such dishing can further lead to non-uniform removal of additional materials from the substrate surface, such as barrier layer material disposed beneath the conductive material or dielectric material and produce a substrate surface having less than desirable quality which can negatively impact the performance of integrated circuits of the semiconductor. In addition, as features on the surface of semiconductors become more and more miniaturized, it becomes increasingly difficult to successfully polish the surfaces of the semiconductors.

Therefore, there is a need for a CMP method and composition for tungsten which at least inhibits corrosion of tungsten, but, preferably, further inhibits dishing.

SUMMARY OF THE INVENTION

The present invention provides a composition for chemical mechanical polishing tungsten, comprising, as initial components: water; an oxidizing agent; a compound having a general formula:

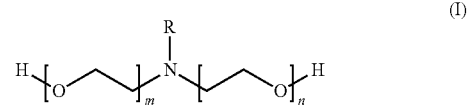

(I)

wherein R is tallow or a tallow amine containing group and m and n are integers, wherein a sum of m+n is from 2 to 24; a colloidal silica abrasive; a dicarboxylic acid or salt thereof; a source of iron (III) ions; and, optionally, a pH adjusting agent; and, optionally, a biocide.

The present invention is also directed to a composition for chemical mechanical polishing tungsten, comprising, as initial components: water; an oxidizing agent; at least 50 ppm of a compound having a general formula:

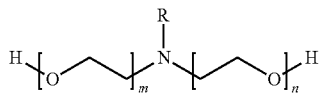
(I)

wherein R is tallow or a tallow amine containing group and m and n are integers, wherein a sum of m+n is from 2 to 24; a colloidal silica abrasive; a dicarboxylic acid or salt thereof; a source of iron (III) ions; and, optionally, a pH adjusting agent; and, optionally, a biocide; wherein a pH of the chemical mechanical polishing composition is 1-7.

The present invention is further directed to a composition for chemical mechanical polishing tungsten, comprising, as initial components: water; 0.01 to 10 wt % of an oxidizing agent; 50 to 500 ppm of a compound having a general formula:

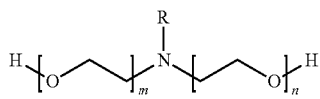
(I)

wherein R is tallow or a tallow amine containing group and m and n are integers, wherein a sum of m+n is from 2 to 24; 0.01 to 15 wt % of a colloidal silica abrasive; 1 to 2,600 ppm of a dicarboxylic acid or salt thereof; 175 to 700 ppm of a source of iron (III) ions; and, optionally, a pH adjusting agent; and, optionally, a biocide; wherein a pH of the chemical mechanical polishing composition is 1.5-4.5.

The present invention is directed to a method of chemical mechanical polishing tungsten, comprising:
providing a substrate comprising tungsten and a dielectric;
providing a chemical mechanical polishing composition, comprising, as initial components: water; an oxidizing agent; a compound having a general formula:

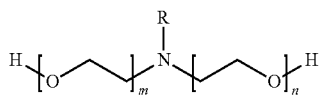
(I)

wherein R is tallow or a tallow amine containing group and m and n are integers, wherein a sum of m+n is from 2 to 24; a colloidal silica abrasive;
a dicarboxylic acid or salt thereof;
a source of iron (III) ions; optionally, a pH adjusting agent; and,
optionally, a biocide;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the tungsten.

The present invention is also directed to a method of chemical mechanical polishing tungsten, comprising:
providing a substrate comprising tungsten and a dielectric;
providing a chemical mechanical polishing composition, comprising, as initial components: water; an oxidizing agent; at least 50 ppm of a compound having a general formula:

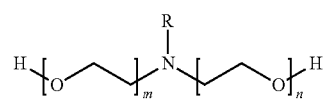
(I)

wherein R is tallow or a tallow amine containing group and m and n are integers, wherein a sum of m+n is from 2 to 24; a colloidal silica abrasive;
a dicarboxylic acid or salt thereof;
a source of iron (III) ions; optionally, a pH adjusting agent; and,
optionally, a biocide; wherein a pH of the chemical mechanical polishing composition is 1-7;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the tungsten; wherein the chemical mechanical polishing composition provided has a tungsten removal rate of ≥1000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The present invention is further directed to a method of chemical mechanical polishing tungsten, comprising:
providing a substrate comprising tungsten and a dielectric;
providing a chemical mechanical polishing composition, comprising, as initial components: water; 0.01 to 10 wt % of an oxidizing agent; 50 to 500 ppm of a compound having a general formula:

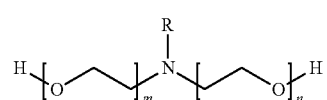
(I)

wherein R is tallow or a tallow amine containing group and m and n are integers, wherein a sum of m+n is from 2 to 24; 0.01 to 15 wt % of a colloidal silica abrasive;
1 to 2,600 ppm of a dicarboxylic acid or salt thereof;
100 to 1100 ppm of a source of iron (III) ions; optionally, a pH adjusting agent; and,
optionally, a biocide; wherein a pH of the chemical mechanical polishing composition is 1.5-4.5;

providing a chemical mechanical polishing pad, having a polishing surface;

creating dynamic contact at an interface between the chemical mechanical polishing pad and the substrate; and dispensing the chemical mechanical polishing composition onto the polishing surface of the chemical mechanical polishing pad at or near the interface between the chemical mechanical polishing pad and the substrate to remove at least some of the tungsten; wherein the chemical mechanical polishing composition provided has a tungsten removal rate of ≥1000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The foregoing chemical mechanical polishing compositions and methods of the present invention polish tungsten and at least inhibit unwanted tungsten corrosion; however, the foregoing chemical mechanical polishing compositions and methods of the present invention can further inhibit dishing.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; µ=µm=microns; kPa=kilopascal; Å=angstroms; mV=millivolts; DI=deionized; ppm=parts per million=mg/L; mm=millimeters; cm=centimeter; min=minute; rpm=revolutions per minute; lbs=pounds; kg=kilograms; W=tungsten; PO=propylene oxide; EO=ethylene oxide; C=tetravalent element carbon; ICP-OES=inductively coupled plasma optical emission spectroscopy; DLS=dynamic light scattering; wt %=percent by weight; RR=removal rate; "—"=chemical bond.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon dioxide formed from the decomposition of tetraethyl orthosilicate ($Si(OC_2H_5)_4$). The term "planar" means a substantially flat surface or flat topography having two dimensions of length and width. The term "dimensions" refers to line widths. The term "alkyl", unless otherwise described in the specification as having substituent groups, means an organic chemical group composed only of carbon and hydrogen (hydrocarbyl) and having a general formula: $C_nH_{2n+1}$, wherein the variable "n" is an integer. The term "alkenyl" means an organic chemical group wherein hydrogen is removed from an alkylene group (alkanediyl), e.g., $H_2C=CH-$ or $HRC=CH-$, wherein R is an organic hydrocarbon (hydrocarbyl) group. The term "moiety" means part of a molecule or functional group of a molecule. The term "tallow" means hydrolyzed animal fat which provides a mixture of free fatty acids which includes, for example, 37-43% oleic acid, 24-32% palmitic acid, 24-32% stearic acid, 3-6% myristic acid and 2-3% linoleic acid which are then converted to fatty amines via a nitrile process prior to being ethoxylated with ethylene oxide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The method of polishing a substrate containing tungsten of the present invention includes a chemical mechanical polishing composition comprising (preferably, consisting of), as initial components, water; an oxidizing agent; a polyethoxylated tallow amine compound having a formula:

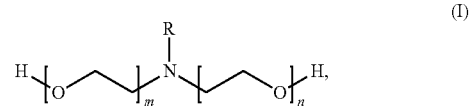

(I)

wherein R is tallow or a tallow amine containing group, wherein the tallow are preferably chosen from a straight-chain or branched-chain ($C_8$-$C_{24}$)alkyl, or a straight-chain or a branched-chain ($C_8$-$C_{24}$)alkenyl group derived from tallow, wherein a tallow amine containing group is a moiety of formula:

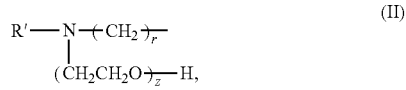

(II)

wherein R' is straight-chain or branched-chain ($C_8$-$C_{24}$) alkyl, or a straight-chain or a branched-chain ($C_8$-$C_{24}$) alkenyl group derived from tallow, m and n are integers, wherein a sum of m+n ranges from 2-24, and r is an integer of 2 to 5, and z is an integer of 1 to 24; a colloidal silica abrasive; a dicarboxylic acid or salt thereof; a source of iron (III) ions; and, optionally, a pH adjusting agent; and optionally a biocide to provide for the removal of tungsten from the substrate surface while at least inhibiting corrosion of the tungsten, but further can inhibit dishing. The chemical mechanical polishing compositions of the present invention can include mixtures of two or more of the foregoing polyethoxylated tallow amines. The foregoing polyethoxylated tallow amines of the present invention are neutral with respect to electric charge.

More preferably, R is a tallow straight-chain chain ($C_{12}$-$C_{20}$)alky or a tallow straight-chain ($C_{12}$-$C_{20}$)alkenyl, wherein the sum of m+n is from 3-15, further preferably, R is a tallow straight-chain ($C_{13}$-$C_{18}$)alkyl or a tallow straight-chain ($C_{13}$-$C_{18}$)alkenyl, wherein the sum of m+n is from 3-5; even more preferably, R is saturated or unsaturated hexadecyl ($C_{16}$), saturated or unsaturated heptadecyl ($C_{17}$), or saturated or unsaturated octadecyl ($C_{18}$), wherein m+n is from 3-5, and, most preferably, R is the moiety having formula (II) above.

Preferably, R' is a straight-chain ($C_{12}$-$C_{20}$)alky or a straight-chain ($C_{12}$-$C_{20}$)alkenyl, wherein r is an integer from 2 to 4, and z is an integer of 3 to 15, more preferably, R' is a straight-chain ($C_{13}$-$C_{18}$)alkyl or a straight-chain ($C_{13}$-$C_{18}$) alkenyl, wherein the sum of m+n is from 3-5 and r is an integer of 2 to 3 and z is an integer of 3 to 5, most preferably, R' is saturated or unsaturated hexadecyl ($C_{16}$), saturated or unsaturated heptadecyl ($C_{17}$), or saturated or unsaturated octadecyl ($C_{18}$), wherein m+n is from 3-5, r is an integer from 2 to 3 and z is an integer of 3 to 5. The chemical mechanical polishing composition of the present invention can include mixtures of two or more of the foregoing polyethoxylated tallow amine compounds having the moiety of formula (II). The foregoing polyethoxylated tallow amines of the present invention are neutral with respect to electric charge.

Examples of preferred polyethoxylated tallow amines of the present invention are polyethoxylated tallow diamines having a general formula:

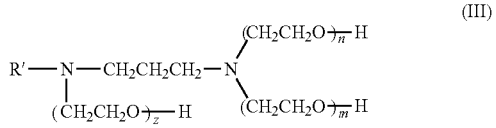

wherein R', m, n and z are as defined above. Preferably, R' is saturated or unsaturated hexadecyl ($C_{16}$), saturated or unsaturated heptadecyl ($C_{17}$), or saturated or unsaturated octadecyl ($C_{18}$), wherein m+n is from 3-5, and z is an integer of 3 to 5, most preferably, m+n=5, and z=5. The chemical mechanical polishing composition of the present invention can include mixtures of two or more of the foregoing polyethoxylated tallow diamines of formula (III). A particularly preferred polyethoxylated tallow diamine of the present invention having the general formula (III) is N,N',N'-polyoxyethylene (10)-N-1,3-diaminopropane commercially available from SIGMA-ALDRICH® Chemicals Company (Milwaukee, Wis., USA).

Preferably in the method of chemical mechanical polishing tungsten of the present invention, the chemical mechanical polishing composition of the present invention, as initial components, includes at least 50 ppm, preferably, from 50 to 500 ppm, more preferably, from 50 ppm to 300 ppm, even more preferably, from 50 ppm to 200 ppm, most preferably, from 50 to 100 ppm of a polyethoxylated tallow amine of the present invention.

Preferably, in the method of chemical mechanical polishing a substrate comprising tungsten of the present invention, the water contained, as an initial component, in the chemical mechanical polishing composition provided is at least one of deionized and distilled to limit incidental impurities.

Preferably, in the method of polishing a substrate of the present invention, the chemical mechanical polishing composition provided contains, as an initial component, an oxidizing agent, wherein the oxidizing agent is selected from the group consisting of hydrogen peroxide ($H_2O_2$), monopersulfates, iodates, magnesium perphthalate, peracetic acid and other per-acids, persulfate, bromates, perbromate, persulfate, peracetic acid, periodate, nitrates, iron salts, cerium salts, Mn (III), Mn (IV) and Mn (VI) salts, silver salts, copper salts, chromium salts, cobalt salts, halogens, hypochlorites and a mixture thereof. More preferably, the oxidizing agent is selected from the group consisting of hydrogen peroxide, perchlorate, perbromate; periodate, persulfate and peracetic acid. Most preferably, the oxidizing agent is hydrogen peroxide.

Preferably, in the method of polishing a substrate of the present invention, the chemical mechanical polishing composition provided contains, as an initial component, 0.01 to 10 wt %, more preferably, 0.1 to 5 wt %; most preferably, 1 to 3 wt % of an oxidizing agent.

Preferably, in the method of polishing a substrate of the present invention, the chemical mechanical polishing composition provided contains, as an initial component, a source of iron (III) ions. More preferably, in the method of the present invention, the chemical mechanical polishing composition provided contains, as an initial component, a source of iron (III) ions, wherein the source of iron (III) ions is selected from the group consisting iron (III) salts. Most preferably, in the method of the present invention, the chemical mechanical polishing composition provided contains, as an initial component, a source of iron (III) ions, wherein the source of iron (III) ions is ferric nitrate (Fe($NO_3$)$_3$).

Preferably, in the method of polishing a substrate of the present invention, the chemical mechanical polishing composition provided contains, as an initial component, a source of iron (III) ions sufficient to introduce 1 to 250 ppm, preferably, 5 to 200 ppm, more preferably, 7.5 to 150 ppm, most preferably, 10 to 100 ppm of iron (III) ions to the chemical mechanical polishing composition.

Preferably, in the method of polishing a substrate of the present invention, the chemical mechanical polishing composition provided contains, as an initial component, a source of iron (III) ions. More preferably, in the method of polishing a substrate of the present invention, the chemical mechanical polishing composition provided contains, as an initial component, 100 to 1,100 ppm, preferably, 125 to 1000 ppm, more preferably, 150 to 850 ppm, and, most preferably, 175 to 700 ppm of a source of iron (III) ions. Most preferably, in the method of polishing a substrate of the present invention, the chemical mechanical polishing composition provided contains, as an initial component, 100 to 1,100 ppm, preferably, 150 to 1000 ppm, more preferably, 150 to 850 ppm, most preferably, 175 to 700 ppm of a source of iron (III) ions, wherein the source of iron (III) ions is ferric nitrate (Fe($NO_3$)$_3$).

Preferably, in the method of polishing a substrate of the present invention, the chemical mechanical polishing composition provided contains a colloidal silica abrasive having a negative zeta potential. More preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3; most preferably, from 2 to 2.5. Still more preferably, in the method of polishing a substrate of the present invention, the chemical mechanical polishing composition provided contains a colloidal silica abrasive having a permanent negative zeta potential, wherein the chemical mechanical polishing composition has a pH of 1 to 7, preferably, of 1.5 to 4.5; more preferably, of 1.5 to 3.5; still more preferably, of 2 to 3; most preferably, from 2 to 2.5 as indicated by a zeta potential from −0.1 mV to −20 mV.

Preferably, in the method of polishing a substrate of the present invention, the chemical mechanical polishing composition provided contains, as an initial component, a colloidal silica abrasive, wherein the colloidal silica abrasive has an average particle size≤100 nm, preferably, 5 to 100 nm; more preferably, 10 to 90 nm; most preferably, 20 to 80 nm as measured by dynamic light scattering techniques (DLS).

Preferably, in the method of polishing a substrate of the present invention, the chemical mechanical polishing composition provided contains 0.01 to 15 wt %, preferably, 0.05 to 10 wt %, more preferably, 0.1 to 7.5 wt %, still more preferably, 0.2 to 5 wt %, most preferably, from 0.2 to 2 wt % of a colloidal silica abrasive. Preferably, the colloidal silica abrasive has a negative zeta potential.

Preferably, in the method of polishing a substrate of the present invention, the chemical mechanical polishing composition provided contains, as an initial component, a dicarboxylic acid, wherein the dicarboxylic acid includes, but is not limited to malonic acid, oxalic acid, succinic acid, adipic acid, maleic acid, malic acid, glutaric acid, tartaric acid, salts thereof or mixtures thereof. More preferably, in the method of polishing a substrate of the present invention, the chemical mechanical polishing composition provided contains, as an initial component, a dicarboxylic acid, wherein the dicarboxylic acid is selected from the group consisting of malonic acid, oxalic acid, succinic acid, tartaric acid, salts thereof and mixtures thereof. Still more preferably, the chemical mechanical polishing composition provided contains, as an initial component, a dicarboxylic acid, wherein the dicarboxylic acid is selected from the group consisting of malonic acid, oxalic acid, succinic acid, salts thereof and mixtures thereof. Most preferably, in the method of polishing a substrate of the present invention, the chemical mechanical polishing composition provided contains, as an initial component, the dicarboxylic acid malonic acid or salts thereof.

Preferably, in the method of polishing a substrate of the present invention, the chemical mechanical polishing composition provided contains, as an initial component, 1 to 2,600 ppm, preferably, 100 to 1,400 ppm, more preferably, 120 to 1,350 ppm, still more preferably, 130 to 1,100 ppm, of a dicarboxylic acid, wherein the dicarboxylic acid includes, but is not limited to, malonic acid, oxalic acid, succinic acid, adipic acid, maleic acid, malic acid, glutaric acid, tartaric acid, salts thereof or mixtures thereof. Preferably, in the method of polishing a substrate of the present invention, the chemical mechanical polishing composition provided contains, as an initial component, 1 to 2,600 ppm of malonic acid, salt thereof or mixtures thereof. More preferably, in the method of polishing a substrate of the present invention, the chemical mechanical polishing composition provided contains, as an initial component 100 to 1,400 ppm, even more preferably, 120 to 1,350 ppm, still more preferably, 130 to 1,350 ppm, of the dicarboxylic acid malonic acid or salts thereof.

Preferably, in the method of polishing a substrate of the present invention, the chemical mechanical polishing composition provided has a pH of 1 to 7. More preferably, in the method of polishing a substrate of the present invention, the chemical mechanical polishing composition provided has a pH of 1.5 to 4.5. Still more preferably, in the method of polishing a substrate of the present invention, the chemical mechanical polishing composition provided has a pH of 1.5 to 3.5. Even still more preferably, in the method of polishing a substrate of the present invention, the chemical mechanical polishing composition provided has a pH of 2 to 3; and, most preferably, a pH of 2 to 2.5.

Preferably, in the method of polishing a substrate of the present invention, the chemical mechanical polishing composition provided, optionally, contains a pH adjusting agent. Preferably, the pH adjusting agent is selected from the group consisting of inorganic and organic pH adjusting agents. Preferably, the pH adjusting agent is selected from the group consisting of inorganic acids and inorganic bases. More preferably, the pH adjusting agent is selected from the group consisting of nitric acid and potassium hydroxide. Most preferably, the pH adjusting agent is potassium hydroxide.

Preferably, in the method of polishing a substrate of the present invention, the chemical mechanical polishing composition provided excludes quaternary compounds. Such quaternary compounds include, but are not limited to, quaternary ammonium compounds, quaternary phosphonium compounds and quaternary antimonium compounds.

Optionally, in the method of polishing a substrate of the present invention, the chemical mechanical polishing composition provided contains a surfactant. Preferably, in the method of polishing a substrate of the present invention, the surfactant is a PO or EO or PO/EO containing surfactant. More preferably, in the method of polishing a substrate of the present invention, the surfactant is a PO or EO or PO/EO surfactant containing an anionic functional group. Even more preferably, in the method of polishing a substrate of the present invention, the surfactant is an anionic ether sulfate having formula (IV):

wherein a can be 12, 15, 18, 20, 22, 25, 28, 30, 35, 38, 40, 42 or 44; b can be 0, 2, 5, 8, 10, 12, 14, 16, 18, 20, 30, 40 or 50; and d can be 0, 5, 10, 15, 20, 25, 30, 35, 40, 45, 50, 55, 60, 65, 70, 80, 90 or 100 with the proviso that b and d cannot be 0 at the same instance, and a counter ion can preferably be an alkali metal ion such as sodium cation or potassium cation; or an ammonium cation. Preferably, in the method of polishing a substrate of the present invention, the anionic ether sulfate is sodium lauryl either sulfate (SLES).

In the method of polishing a substrate of the present invention, the chemical mechanical polishing composition provided can contain, as an initial component, 50 ppm to 1000 ppm, preferably, 100 ppm to 900 ppm, more preferably, 120 ppm to 600 ppm, still more preferably, 140 ppm to 250 ppm, of an anionic ether sulfate. More preferably, in the method of polishing a substrate of the present invention, the chemical mechanical polishing composition provided contains, as an initial component, 50 to 1000 ppm, more preferably, 100 ppm to 900 ppm, even more preferably 120 ppm to 600 ppm, still more preferably, 140 ppm to 250 ppm, of an alkali metal salt of an anionic ether sulfate surfactant. Still more preferably, in the method of polishing a substrate of the present invention, the chemical mechanical polishing composition provided contains, as an initial component 50 ppm to 1000 ppm, preferably, 100 ppm to 900 ppm, more preferably, 120 ppm to 600 ppm, still more preferably, 140 ppm to 250 ppm, of sodium lauryl ether sulfate.

Optionally, the polishing composition can contain biocides, such as KORDEX™ MLX (9.5-9.9% methyl-4-isothiazolin-3-one, 89.1-89.5% water and ≤1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the chemical mechanical polishing compositions of the present invention in conventional amounts, as known to those of ordinary skill in the art.

Preferably, in the method of polishing a substrate of the present invention, the chemical mechanical polishing composition provided excludes azole compounds. Such azole compounds include, but are not limited to, benzotriazole, mercaptobenzothiazole, tolyltriazole and imidazole.

Preferably, the substrate provided is a semiconductor substrate comprising tungsten and a dielectric such as TEOS.

Preferably, in the method of polishing a substrate of the present invention, the chemical mechanical polishing pad provided can by any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

Preferably, in the method of polishing a substrate of the present invention, the chemical mechanical polishing composition provided has a tungsten removal rate≥1,000 Å/min; preferably, ≥1,500 Å/min; more preferably, ≥1,700 Å/min; and with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The following examples are intended to illustrate the corrosion inhibiting performance of the chemical mechanical polishing composition of the present invention on tungsten, and the inhibition of tungsten dishing, but the following examples are not intended to limit the scope of the invention.

Example 1

Polishing Slurry Formulations

The chemical mechanical polishing compositions of this example were prepared by combining the components in the amounts listed in Table 1 with the balance being DI water and adjusting the pH of the compositions to the final pH listed in Table 1 with 45 wt % potassium hydroxide.

TABLE 1

| Polishing Slurry # | Abrasive[1] (wt %) | Polyethoxylated Tallow Diamine[2] (5 EO) (ppm) | $Fe(NO_3)_3$ (ppm) | Malonic Acid (ppm) | $H_2O_2$ (wt %) | pH |
|---|---|---|---|---|---|---|
| Control 1 | 2 | — | 362 | 1320 | 2 | 2.5 |
| Control 2 | 2 | — | 637 | 1320 | 2 | 2.5 |
| PS-1 | 2 | 50 | 362 | 1320 | 2 | 2.5 |
| PS-2 | 2 | 500 | 362 | 1320 | 2 | 2.5 |
| PS-3 | 2 | 50 | 637 | 1320 | 2 | 2.5 |

[1]KLEBOSOL ™ 1598-B25 (—) zeta potential abrasive slurry manufactured by AZ Electronics Materials, available from The Dow Chemical Company.
[2]N,N',N'-polyoxyethylene (10)-N-tallow-1,3-diaminopropane (available from SIGMA-ALDRICH ® Chemicals Company)

Example 2

Corrosion Rate Inhibition Performance of Polyethoxylated Tallow Diamine CMP Slurries The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 $cm^2$. The results of the corrosion tests are in Table 2.

TABLE 2

| Polishing Slurry # | W Corrosion Rate (Å/min) |
|---|---|
| Control 1 | 35 |
| Control 2 | 25 |
| PS-1 | 26.5 |
| PS-2 | 0.2 |
| PS-3 | 0.1 |

Example 3

Chemical Mechanical Polishing—Dishing Performance of Polyethoxylated Tallow Diamine CMP Slurry The polishing experiments were performed on 200 mm blanket wafers installed on an Applied Materials 200 mm MIRRA® polishing machine. The polishing removal rate experiments were performed on 200 mm blanket 15kÅ-thick TEOS sheet wafers from Novellus and W, Ti, and TiN blanket wafers available from WaferNet Inc., Silicon Valley Microelectronics or SKW Associates, Inc. All polishing experiments were performed using an IC1010™ polyurethane polishing pad paired with an SP2310 subpad (commercially available from Rohm and Haas Electronic Materials CMP Inc.) with a typical down pressure of 21.4 kPa (3.1 psi), a chemical mechanical polishing composition flow rate of 125 mL/min, a table rotation speed of 80 rpm and a carrier rotation speed of 81 rpm unless specified otherwise. A Kinik PDA33A-3 diamond pad conditioner (commercially available from Kinik Company) was used to dress the polishing pad. The polishing pad was broken in with the conditioner using a down force of 9.0 lbs (4.1 kg) for 15 minutes and 7.0 lbs (3.2 kg) for 15 minutes at 80 rpm (platen)/36 rpm (conditioner). The polishing pad was further conditioned ex-situ prior to polishing using a down force of 7 lbs (3.2 kg) for 24 seconds. The W dishing rates were determined using a KLA-Tencor RS100C metrology tool. The wafers had varying standard line width features as shown in Table 3.

TABLE 3

| Polishing Slurry # | 100 μm/100 μm dishing (Å) | 9 μm/1 μm dishing (Å) | 25 μm/25 μm dishing (Å) |
|---|---|---|---|
| Control 2 | 1250 | 351 | 201 |
| PS-3 | 1237 | 146 | 43 |

The slurry which contained the polyethoxylated tallow diamine of the present invention showed significant dishing inhibition in comparison to the control which excluded the polyethoxylated tallow diamine.

Example 4

Slurry Formulations

TABLE 4

| Polishing Slurry # | Abrasive[1] (wt %) | Polyethoxylated Tallow Diamine[2] (5 EO) (ppm) | Fe(NO$_3$)$_3$ (ppm) | Malonic Acid (ppm) | H$_2$O$_2$ (wt %) | pH[3] |
|---|---|---|---|---|---|---|
| Control 3 | 2 | — | 637 | 1320 | 2 | 2.5 |
| PS-4 | 2 | 100 | 637 | 1320 | 2 | 2.5 |
| PS-5 | 2 | 200 | 637 | 1320 | 2 | 2.5 |
| PS-6 | 2 | 300 | 637 | 1320 | 2 | 2.5 |

[1]KLEBOSOL ™ 1598-B25 (—) zeta potential abrasive slurry manufactured by AZ Electronics Materials, available from The Dow Chemical Company.
[2]N,N',N'-polyoxyethylene (10)-N-tallow-1,3-diaminopropane.
[3]pH was adjusted with 45 wt % potassium hydroxide solution.

Example 5

Corrosion Rate Inhibition Performance of Polyethoxylated Tallow Diamine CMP Slurries The corrosion tests were carried out by immersing W blanket wafers (1 cm×4 cm) in 15 g slurry samples. The W wafers were removed from tested slurries after 10 min. The solutions were subsequently centrifuged for 20 min at 9,000 rpm to remove slurry particles. The supernatant was analyzed by ICP-OES to determine the amount of tungsten by weight. The corrosion rate (Å/min) was converted from the W mass assuming an etching wafer surface area of 4 cm$^2$. The results of the corrosion tests are in Table 5.

TABLE 5

| Polishing Slurry # | W Corrosion Rate (Å/min) |
|---|---|
| Control | 23 |
| PS-4 | <0.1 |
| PS-5 | <0.1 |
| PS-6 | <0.1 |

The results of the corrosion rate tests showed that the chemical mechanical polishing slurries which contained the polyethoxylated tallow diamine with ethoxylations (m+n) of 5 significantly reduced the corrosion of W on wafers in contrast to the control which excluded the ethoxylates.

Example 6

Chemical Mechanical Polishing—Dishing Performance of Polyethoxylated Tallow Diamine CMP Slurries The chemical mechanical setup for this example was as follows:
Tool: AMAT Mirra with Titan SP Head.
Slurry: PS-4.
Pad: IC1000, 1010 groove with SP2310 sub-pad.
Disk: Kinik PDA33A-3 (AD3CI-171040-3).
Recipes:
Pad break-in: 80 rpm/36 rpm, 9.0 lbf CDF–15 mins+7.0 lbf CDF–15 mins.
Polishing: 80 rpm/81 rpm, 3.1 psi, 60 sec, 125 ml/min.
Conditioning: ex-situ: 80 rpm/36 rpm, 7.5 lbf CDF, 24 sec.
Methodology/Polishing Procedures:
Pad break-in 30 mins.

TABLE 6

| Polishing Slurry # | 100 μm/100 μm dishing (Å) | 9 μm/1 μm dishing (Å) | 25 μm/25 μm dishing (Å) |
|---|---|---|---|
| Control 3 | 1303 | 347 | 265 |
| PS-4 | 819 | 74 | 57 |

The chemical mechanical polishing slurry of the present invention which included the polyethoxylated tallow diamine (5 EO) had significantly improved dishing performance over the control on all features sizes.

What is claimed is:
1. A chemical mechanical polishing composition consisting of, as initial components: water; an oxidizing agent; a compound having a general formula:

$$H{-}{\left[O{\sim}\right]}_m{-}\underset{R}{N}{-}{\left[{\sim}O\right]}_n{-}H \quad (I)$$

wherein R is a tallow amine containing group having the formula:

$$R'{-}\underset{(CH_2CH_2O)_z{-}H}{N}{-}(CH_2)_r{-} \quad (II)$$

wherein R' is straight-chain or branched-chain (C$_8$-C$_{24}$) alkyl, or a straight-chain or a branched-chain (C$_8$-C$_{24}$) alkenyl group derived from tallow, r is an integer of 2 to 5, and z is an integer of 1 to 24 and m and n are integers, wherein a sum of m+n ranges from 2-24;
a colloidal silica abrasive;
a dicarboxylic acid;
a source of iron (III) ions;
a pH of 1-7;
optionally, a pH adjusting agent;
optionally, a biocide; and, optionally, a surfactant selected from the group consisting of propylene oxide, ethylene oxide and propylene oxide/ethylene oxide containing surfactant.

2. The chemical mechanical polishing composition of claim 1, wherein the compound having formula (I) is in amounts of at least 50 ppm.

3. The chemical mechanical polishing composition of claim 1, wherein the sum of m+n ranges from 3 to 15.

4. A method of chemical mechanical polishing tungsten, comprising:
providing a substrate comprising tungsten and a dielectric;
providing a chemical mechanical polishing composition, consisting of, as initial components:
water;
an oxidizing agent;
a compound having a formula:

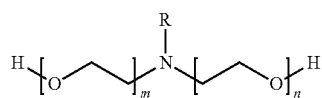 (I)

wherein R is a tallow amine containing group having the formula:

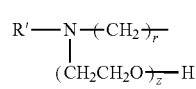 (II)

wherein R' is straight-chain or branched-chain ($C_8$-$C_{24}$) alkyl, or a straight-chain or a branched-chain ($C_8$-$C_{24}$) alkenyl group derived from tallow, r is an integer of 2 to 5, and z is an integer of 1 to 24 and m and n are integers, wherein a sum of m+n ranges from 2-24;
a colloidal silica abrasive;
a dicarboxylic acid;
a source of iron (III) ions;
optionally, a pH adjusting agent;
optionally, a biocide; and,
optionally, a surfactant selected from the group consisting of propylene oxide, ethylene oxide and propylene oxide/ethylene oxide containing surfactant;
providing a chemical mechanical polishing pad, having a polishing surface;
creating dynamic contact at an interface between the chemical mechanical polishing pad and the substrate; and
dispensing the chemical mechanical polishing composition onto the polishing surface of the chemical mechanical polishing pad at or near the interface between the chemical mechanical polishing pad and the substrate to remove at least some of the tungsten.

5. The method of claim 4, wherein the sum of m+n ranges from 3 to 15.

6. The method of claim 4, wherein the chemical mechanical polishing composition provided has a tungsten removal rate of ≥1000 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

7. The method of claim 4, wherein the chemical mechanical polishing composition, provided consists of, as initial components:
the water;
0.01 to 10 wt % of the oxidizing agent;
50 to 500 ppm of the compound of formula (I);
0.01 to 15 wt % of the colloidal silica abrasive;
1 to 2,600 ppm of the dicarboxylic acid;
100 to 1,100 ppm of the source of iron (III) ions, wherein the source of iron (III) ions is ferric nitrate; and,
optionally, the pH adjusting agent;
optionally, a surfactant selected from the group consisting of propylene oxide, ethylene oxide and propylene oxide/ethylene oxide containing surfactant;
optionally, the biocide; and,
wherein the chemical mechanical polishing composition has a pH of 1.5-4.5.

8. The method of claim 7, wherein the chemical mechanical polishing composition provided has a tungsten removal rate of ≥1500 Å/min with a platen speed of 80 revolutions per minute, a carrier speed of 81 revolutions per minute, a chemical mechanical polishing composition flow rate of 125 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

9. The chemical mechanical polishing composition of claim 1, wherein the compound has the general formula:

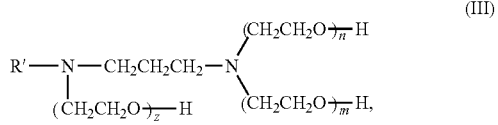 (III)

wherein R' is saturated or unsaturated hexadecyl, saturated or unsaturated heptadecyl, or saturated or unsaturated octadecyl, m+n is from 3-5 and z is an integer of 3 to 5.

* * * * *